United States Patent [19]

Poliniak et al.

[11] 4,267,257

[45] May 12, 1981

[54] METHOD FOR FORMING A SHALLOW SURFACE RELIEF PATTERN IN A POLY(OLEFIN SULFONE) LAYER

[75] Inventors: Eugene S. Poliniak, Willingboro; Nitin V. Desai, Edison, both of N.J.

[73] Assignee: RCA Corporation, New York, N.Y.

[21] Appl. No.: 710,135

[22] Filed: Jul. 30, 1976

[51] Int. Cl.³ .............................................. B05D 3/06
[52] U.S. Cl. ................................. 430/270; 427/43.1; 430/296; 430/324; 430/326
[58] Field of Search ........ 204/192 E, 192 EC, 159.92; 427/38, 39, 41, 43; 96/35.1, 36.2, 115 R

[56] References Cited

U.S. PATENT DOCUMENTS 3,935,331   1/1976   Poliniak et al. ..................... 427/43
3,935,332   1/1976   Poliniak et al. ..................... 427/43

*Primary Examiner*—John H. Newsome
*Attorney, Agent, or Firm*—H. Christoffersen; Birgit E. Morris; Allen Bloom

[57] ABSTRACT

This invention pertains to an electron beam resist method for forming a surface relief pattern in a poly(oelfin sulfone) layer wherein the polymer layer is useful for depositing a metal film thereon and thereby forming a corresponding surface relief pattern in the metal film. The surface relief pattern is formed using poly(3-methyl-1-cyclopentene sulfone) as the poly(olefin sulfone) layer and using a mixture of cycloheptanone and 2-methylcyclohexanol or a mixture of 2-methylcyclohexanone and 3-methylcyclohexanol as the developer for the poly(3-methyl-1-cyclopentene sulfone) layer.

2 Claims, 3 Drawing Figures

METHOD FOR FORMING A SHALLOW SURFACE RELIEF PATTERN IN A POLY(OLEFIN SULFONE) LAYER

CROSS REFERENCES TO RELATED APPLICATIONS

This invention is related to copending applications Ser. No. 710,184 filed July 30, 1976 entitled "Method of Transferring a Surface Relief Pattern from a Poly(olefin sulfone) Layer to a Metal Layer" by E. S. Poliniak, N. V. Desai, and R. J. Himics now U.S. Pat. No. 4,045,318; to copending application Ser. No. 710,134 filed July 30, 1976 entitled "Method of Transferring a Surface Relief Pattern From a Wet Poly(olefin sulfone) Layer to a Metal Layer" by E. S. Poliniak, and N. V. Desai, now U.S. Pat. No. 4,126,712, and to copending application Ser. No. 710,133 filed July 30, 1976 entitled "Method for Forming a Surface Relief Pattern in a Poly(olefin sulfone) Layer" by E. S. Poliniak and N. V. Desai now U.S. Pat. No. 4,153,741; filed concurrently with this application and herein incorporated by reference.

BACKGROUND OF THE INVENTION

Surface relief patterns formed in poly(olefin sulfone) layers by electron beam recording may be transferred to a metal surface for utilization as stamping masters. One method is to transfer the surface relief patterns from the poly(olefin sulfone) layer to the metal layer by sputter etching, which has been described in the above mentioned copending applications and described by M. J. Bowden and L. G. Thompson in the *Journal of the Electrochemical Society*, 121 1620 (1974). When transferring by sputter etching is to be employed, it is desired to form deep penetration surface relief patterns in the polymer layer. Another method of transferring is to deposit a metal layer on the surface relief pattern in the poly(olefin sulfone) layer by such methods as electroplating or vapor deposition and then separate the deposited metal layer from the poly(olefin sulfone) layer. One such method is described in a copending application of Poliniak, Himics, and Wielicki, Serial No. 599,589 filed July 28, 1975 now U.S. Pat. No. 4,007,295. When metal deposition is to be employed, it is desired to form a surface relief pattern in the poly(olefin sulfone) layer with smooth walls of shallow depth at low electron beam exposure levels.

SUMMARY OF THE INVENTION

It has been found that forming a surface relief pattern by exposing a poly(3-methyl-1-cyclopentene sulfone) layer to a modulated beam of electrons and developing the exposed layer either with a mixture of cycloheptanone and 2-methylcyclohexanol or with a mixture of 2-methylcyclohexanone and 3-methylcyclohexanol produces shallow and smoothed-wall surface relief patterns with no erosion of the poly(3-methyl-1-cyclopentene sulfone) layer at very low electron beam exposure levels. These shallow, well defined surface relief patterns provide excellent molds for transferring the surface relief patterns into metal layers which are deposited onto the polymer layer.

DETAILED DESCRIPTION OF THE INVENTION

Figure 1:
FIGS. 1-3 are photomicrographs of surface relief patterns formed in poly(3-methyl-1-cyclopentene sulfone) layers.

Poly(3-methyl-1-cyclopentene sulfone) having a molecular weight of about 500,000 to about 3,000,000 and preferably about 2,000,000, is dissolved in a solvent and coated from solution onto a metal layer to form a polymer layer about 0.3 to 1.0 micron thick by well known techniques such as spinning, brushing, dipping and the like. The solvent may then be removed by baking or vacuum drying the polymer layer. Surface relief patterns are formed in the poly(3-methyl-1-cyclopentene sulfone) polymer layer by exposing the polymer layer to a modulated beam of electrons and contacting the polymer layer with a solvent developer. Although the exact mechanism of recording is not known, it is believed the electron beam degrades the $-SO_2-C-$ linkage. This changes the solubility characteristics of the polymer so that, for positive acting polymers, contact with the developer solvent dissolves the exposed portions of the layer more rapidly than the unexposed portions.

Additional details for preparing poly(3-methyl-1-cyclopentene sulfone) layers on metal layers and recording surface relief patterns thereon are described in U.S. Pat. 3,893,127 to Kaplan et al, and U.S. Pat. Nos. 3,935,331 and 3,935,332 to Poliniak et al which are incorporated herein by reference.

According to the present invention, poly(3-methyl-1-cyclopentene sulfone) is utilized as the poly(olefin sulfone) layer for forming a surface relief pattern by exposing to a modulated electron beam and developing either with a mixture of cycloheptanone and 2-methylcyclohexanol or with a mixture of 2-methylcyclohexanone and 3-methylcyclohexanol. The preferred mixtures contain 50% by weight of each solvent. Utilizing the developers of the present invention with an exposed poly(3-methyl-1-cyclo-pentene layer, surface relief patterns can be formed with electron beam exposures as low as 1,3 microcoulombs/cm$^2$ or less, which allows for rapid electron beam scanning. For example, at a 1.3 microcoulombs/cm$^2$ exposure, surface relief patterns can be formed with scanning speeds of 50 cm/sec. employing a 10 kilovolt - 3 nanoampere modulated electron microscope emitting a Gaussian shaped beam having a diameter of approximately 0.5 micron. The indentations of the surface relief patterns formed under these conditions will produce sharp, shallow troughs with no erosion of the unexposed polymer layer.

While there are numerous poly(olefin sulfones) and numerous possible developers, only poly(3-methyl-1-cyclopentene sulfone) used with the developers of the present invention have been found to produce surface relief patterns which exhibit the above described properties at low electron beam exposure levels.

After formation of the surface relief pattern in the polymer layer, the surface relief pattern is transferred to a metal layer by depositing the metal layer onto the polymer layer and then separating the metal layer from the polymer layer. Suitably the metal layer is formed by vapor depositing a thin layer of gold about 1,000 to 5,000 angstroms thick on the polymer layer, followed by electroplating a thicker layer of nickel onto the gold layer.

The invention will be further illustrated by the following examples but it is to be understood that the invention is not meant to be limited to the details described therein.

EXAMPLES 1-50

Gold metal layers approximately 2,000 angstroms thick were vapor deposited on a series of 1.3 cm by 1.3 cm glass slides. A solution of 10 percent by weight poly(3-methyl-1-cyclopentene sulfone) having a molecular weight of 500,000 and 90 percent by weight cyclopentanone solvent was spun at the rate of 1,000 rpm on each gold plated slide forming poly(3-methyl-1-cyclopentene sulfone) layers about 1 micron thick. The samples were then covered and allowed to set overnight in order to relieve any stress which may have developed in the layers.

Utilizing a 10 kilovolt—3 nanoampere modulated scanning electron beam microscope producing a Gaussian shaped beam with an approximate diameter of 0.5 micron, four raster groups were formed on each polymer layer using scanning speeds of 2.5, 10, 25, and 50 centimeters per second which corresponded to exposure levels of 26.0, 6.7, 2.3, and 1.3 microcoulombs/cm$^2$ respectively. The polymer layers were then developed by contacting them with the separate developers listed in the Table. When the cycloheptanone/2-methylcyclohexanol and the 2-methylcyclohexanone/3-methylcyclohexanol mixtures were employed, the polymer layers were developed for 5 minutes. As the results recorded in the Table show, only the developers of the present invention produced surface relief patterns at scan speeds of 50 cm/sec. (1.3 microcoulombs/cm$^2$ exposure) having shallow, sharp-edged, straight-walled surface relief patterns with no erosion of the polymer layer. The X's in the Table indicate the highest scan speed at which surface relief patterns formed.

Figure 2:
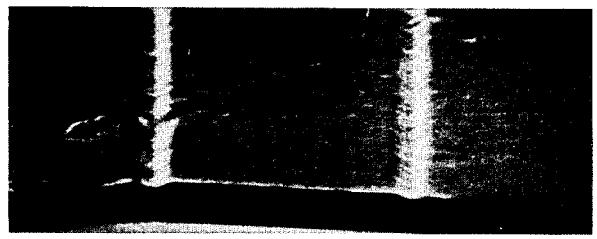
Figure 3:
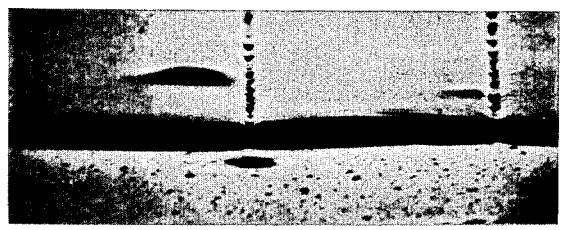

FIGS. 1 and 2 are photomicrographs of EXAMPLES 1 and 2 illustrating the excellent quality of the surface relief patterns suitable for shallow relief plating applications obtained utilizing a scan speed of 50 cm/sec. with the developers of the present invention. FIG. 3 is a photomicrograph of EXAMPLE 3 indicating a jagged pattern not suitable for shallow relief plating applications obtained at a scan speed of 50 cm/sec. with a developer not of the present invention.

TABLE

| EX. | DEVELOPER | 2.5 (26.0) | 10 (6.7) | 25 (2.3) | 50 cm/sec. (1.3 microcoulomb/cm$^2$) | COMMENTS |
| --- | --- | --- | --- | --- | --- | --- |
| 1 | 50% 2-Methylcyclohexanone / 50% 3-Methylcyclohexanol | | | X | X | shallow indentations & smooth walls - no erosion |
| 2 | 50% Cycloheptanone / 50% 2-Methylcyclohexanol | | | X | X | shallow indentations & smooth walls - no erosion |
| 3 | 50% 2-Methylcyclohexanone / 50% 2-Methylcyclohexanol | | | X | X | deep indentations at 25 cm/sec., jagged walls at 50 cm/sec. |
| 4 | 15% Benzene: / 85% 2-Methylcyclohexanol | | | X | | deep indentations |
| 5 | 2-Methylcyclohexanol | X | | | | insensitive |
| 6 | 4-Methylcyclohexanol | X | | | | insensitive |
| 7 | Cyclopentanol | X | | | | insensitive |
| 8 | 3,3-Dimethyl-2-butanone | | | X | | sloped walls |
| 9 | 2,6-Dimethyl-4-heptanone | X | | | | insensitive |
| 10 | 3-Methyl-5-hexanone | | X | | | insensitive |
| 11 | 5-Methyl-5-hexanone | | | X | | sloped walls |
| 12 | Isopropanol | X | | | | insensitive |
| 13 | Methyl Cellosolve Acetate | X | | | | insensitive |
| 14 | Methanol | X | | | | insensitive |
| 15 | 3-Methyl-2-butanol | X | | | | insensitive |
| 16 | P-Cymene | X | | | | insensitive |
| 17 | 3-Heptanone | X | | | | sloped walls |
| 18 | 2,4-Dimethyl-3-pentanone | X | | | | insensitive |
| 19 | Methyl Isobutyl Ketone | | X | | | sloped walls |
| 20 | 2-Heptanone | | X | | | sloped walls |
| 21 | Isopropyl Acetate | X | | | | sloped walls |
| 22 | Isobutyl Acetate | X | | | | sloped walls |
| 23 | 4-Heptanone | X | | | | insensitive |
| 24 | 1,4-Dioxane | | X | | | sloped walls |
| 25 | Pentyl Acetate | | | X | | high erosion |
| 26 | Iso Pentyl Acetate | | X | | | sloped walls |
| 27 | 3-Methyl-2-pentanone | | X | | | sloped walls |
| 28 | Carbon Tetrachloride | | X | | | sloped walls |
| 29 | Acetone | | | X | | sloped walls |
| 30 | Chlorocyclohexane | | X | | | insensitive |
| 31 | Cyclohexyl Acetate | | X | | | insensitive |
| 32 | 3-Methylcyclohexanone | | | X | X | sloped walls |
| 33 | 2-Methylcyclohexanone | | | X | | sloped walls |
| 34 | Benzene | | | X | | sloped walls |
| 35 | Acetophenone | X | | | | insensitive |
| 36 | Butylbenzene | | X | | | sloped walls |
| 37 | 2-Methoxyethyl Acetate | | X | | | sloped walls |
| 38 | Ethylbenzene | X | | | | sloped walls |
| 39 | Xylene | X | | | | sloped walls |
| 40 | Cyclohexanone | | X | | | insensitive |
| 41 | Cycloheptanone | | X | | | sloped walls |
| 42 | Cyclopentanone | | X | | | insensitive |
| 43 | Triethylbenzene | | X | | | insensitive |

TABLE-continued

| EX. | DEVELOPER | SCAN SPEED (EXPOSURE LEVEL) | | | | COMMENTS |
| --- | --- | --- | --- | --- | --- | --- |
| | | 2.5 (26.0) | 10 (6.7) | 25 (2.3) | 50 cm/sec. (1.3 microcoulomb/cm²) | |
| 44 | Dimethylsulfoxide | | X | | | insensitive |
| 45 | 2-Octanone | | X | | | sloped walls |
| 46 | 3-Octanone | X | | | | insensitive |
| 47 | 4-Octanone | X | | | | insensitive |
| 48 | 3-Methylcyclohexanol | X | | | | insensitive |
| 49 | 30% Acetonyl Acetate / 70% Acetone | | | | | dissolved polymer layer |

What is claimed is:

1. A method for forming a surface relief pattern in a metal layer which comprises:
   (a) exposing a poly (3-methyl-1-cyclopentene sulfone) layer to a modulated beam of electrons whereby the portion of the polymer layer exposed to the electron beam becomes more soluble in a solvent developer than the unexposed portions;
   (b) contacting the exposed polymer layer to a solvent developer which is a mixture of about 50% by weight cycloheptanone and about 50% by weight 2-methylcyclohexanol whereby a surface relief pattern is formed in the polymer layer; and
   (c) depositing a metal layer on the surface relief pattern in the polymer layer whereby the surface relief pattern is formed in the metal layer.

2. A method for forming a surface relief pattern in a metal layer which comprises:
   (a) exposing a poly (3-methyl-1-cyclopentene sulfone) layer to a modulated beam of electrons whereby the portion of the polymer layer exposed to the electron beam becomes more soluble in a solvent developer than the unexposed portions;
   (b) contacting the exposed polymer layer to a solvent developer which is a mixture of about 50% by weight 2-methyl cyclohexanone and about 50% by weight 3-methylcyclohexanol whereby a surface relief pattern is formed in the polymer layer; and
   (c) depositing a metal layer on the surface relief pattern in the polymer layer whereby the surface relief pattern is formed in the metal layer.

* * * * *